US012642016B2

(12) United States Patent
Tadjer et al.

(10) Patent No.: US 12,642,016 B2
(45) Date of Patent: May 26, 2026

(54) DIAMOND-CAPPED GALLIUM OXIDE TRANSISTOR

(71) Applicant: The Government of the United States of America, as represented by the Secretary of the Navy, Arlington, VA (US)

(72) Inventors: Marko J. Tadjer, Vienna, VA (US); Joseph A. Spencer, Springfield, VA (US); Alan G. Jacobs, Rockville, MD (US); Hannah N. Masten, Alexandria, VA (US); James Spencer Lundh, Gaithersburg, MD (US); Karl D. Hobart, Alexandria, VA (US); Travis J. Anderson, Alexandria, VA (US); Tatyana I. Feygelson, Springfield, VA (US); Bradford B. Pate, Arlington, VA (US); Boris N. Feigelson, Springfield, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 320 days.

(21) Appl. No.: 18/490,878

(22) Filed: Oct. 20, 2023

(65) Prior Publication Data

US 2024/0136180 A1    Apr. 25, 2024
US 2024/0234139 A9    Jul. 11, 2024

Related U.S. Application Data

(60) Provisional application No. 63/418,180, filed on Oct. 21, 2022.

(51) Int. Cl.
     *H10P 14/20*      (2026.01)
     *H10D 30/47*      (2025.01)
     (Continued)

(52) U.S. Cl.
     CPC ..... *H10P 14/3434* (2026.01); *H10D 30/4755* (2025.01); *H10D 30/6755* (2025.01);
     (Continued)

(58) Field of Classification Search
     CPC .............. H10W 40/254; H10P 14/3406; H10P 14/3434; H10D 62/8303; H10D 62/8271; H10D 30/6755–6756
     See application file for complete search history.

(56) References Cited

U.S. PATENT DOCUMENTS 9,159,641 B2    10/2015   Hobart et al.
9,196,703 B2    11/2015   Hobart et al.
(Continued)

OTHER PUBLICATIONS

M. Higashiwaki, "β Gallium Oxide Devices, Progress and Outlook," Phys. Status Solidi RRL, 15, 2100357 (2021).
(Continued)

*Primary Examiner* — Amar Movva
(74) *Attorney, Agent, or Firm* — US Naval Research Laboratory; Jorie L. Stroup

(57)      ABSTRACT

A method for growing nanocrystalline diamond (NCD) on $Ga_2O_3$ to provide thermal management in $Ga_2O_3$-based devices. A protective $SiN_x$ interlayer is deposited on the $Ga_2O_3$ before growth of the NCD layer to protect the $Ga_2O_3$ from damage caused during growth of the NCD layer. The presence of the NCD provides thermal management and enables improved performance of the $Ga_2O_3$-based device.

14 Claims, 8 Drawing Sheets

(51) Int. Cl.

| | |
|---|---|
| *H10D 30/67* | (2025.01) |
| *H10D 30/80* | (2025.01) |
| *H10D 62/80* | (2025.01) |
| *H10D 62/82* | (2025.01) |
| *H10P 14/24* | (2026.01) |
| *H10W 40/25* | (2026.01) |

(52) U.S. Cl.
CPC ........... *H10D 30/801* (2025.01); *H10D 62/80* (2025.01); *H10D 62/8271* (2025.01); *H10P 14/24* (2026.01); *H10P 14/3406* (2026.01); *H10W 40/254* (2026.01)

(56) References Cited

U.S. PATENT DOCUMENTS

| | | | |
|---|---|---|---|
| 9,305,858 | B2 | 4/2016 | Hobart et al. |
| 9,331,163 | B2 | 5/2016 | Koehler et al. |
| 9,466,684 | B2 | 10/2016 | Koehler et al. |
| 10,312,175 | B1 | 6/2019 | Hobart et al. |
| 10,424,643 | B2 | 9/2019 | Hobart et al. |
| 11,131,039 | B2 | 9/2021 | Hobart et al. |
| 11,634,834 | B2 | 4/2023 | Hobart et al. |
| 2022/0223586 | A1 | 7/2022 | Chowdhury et al. |
| 2023/0031266 | A1 | 2/2023 | Chowdhury et al. |

OTHER PUBLICATIONS

M. Higashiwaki et al., "Gallium oxide (Ga2O3) metal semiconductor field effect transistors on single crystal β-Ga2O3 (010) substrates," Appl. Phys. Lett. 100, 013504 (2012).

S. J. Pearton, et al., "A review of Ga2O3 materials, processing, and devices," Applied Physics Reviews 5, 011301 (2018).

Andrew J. Green, et al., "β-Gallium oxide power electronics," APL Materials 10, 029201 (2022).

Joseph A. Spencer, et al., "A review of band structure and material properties of transparent conducting and semiconducting oxides: Ga2O3, Al2O3, In2O3, ZnO, SnO2, CdO, NiO, CuO, and Sc2O3," Applied Physics Reviews 9, 011315 (2022).

Akito Kuramata et al., "High quality β Ga2O3 single crystals grown by edge defined film fed growth," Japanese Journal of Applied Physics 55, No. 12 (2016): 1202A2.

Adam T. Neal, et al., "Donors and deep acceptors in β Ga2O3," Applied Physics Letters 113, No. 6 (2018).

Darshana Wickramaratne, et al., "Donor doping of corundum (AlxGa1 x)2O3," Applied Physics Letters 121, No. 4 (2022).

Arkka Bhattacharyya, et al., "4.4 kV β Ga2O3 MESFETs with power figure of merit exceeding 100 MW cm 2," Applied Physics Express 15, No. 6 (2022): 061001.

Man Hoi Wong et al., "Vertical β Ga$_2$O$_3$ power transistors: A review." IEEE Transactions on Electron Devices 67, No. 10 (2020): 3925 3937.

C. Yuan, et al., "Modeling and analysis for thermal management in gallium oxide field-effect transistors," J. Appl. Phys. 127, 154502 (2020).

M. Malakoutian et al., "Polycrystalline diamond growth on β-Ga2 O3 for thermal management," 2021 Appl. Phys. Express 14 055502.

Y. Xu et al., "Direct wafer bonding of Ga2O3 SiC at room temperature," Ceramics International 45 (5) 6552 (2019).

M. Liao et al., "Interfacial Thermal Transport of Thinned and Chemical Mechanical Polished (−201) β-Ga2O3 Direct Wafer Bonded to (001) Si," Electronic Materials Conference, 2022, pp. 110-111.

J.S. Lundh et al., "AlN-capped β-(AlxGa1-x)2O3/Ga2O3 heterostructure field-effect transistors for near-junction thermal management of next generation power devices," Proc. Dev. Res. Conf. (2022).

Yong Cai et al., "Control of Threshold Voltage of AlGaN/GaN HEMTs by Fluoride-Based Plasma Treatment: From Depletion Mode to Enhancement Mode," IEEE Transactions on Electron Devices, vol. 53, No. 9, Sep. 2006, pp. 2207-2215.

Yong Cai et al., "High-Performance Enhancement-Mode AlGaN/ GaN HEMTs Using Fluoride-Based Plasma Treatment," IEEE Electron Device Letters, vol. 26, No. 7, Jul. 2005, pp. 435-437.

Kornelius Tetzner, et al., "Lateral 1.8 kV β-Ga2O3 MOSFET With 155 MW/cm2 Power Figure of Merit," IEEE Electron Device Letters, vol. 40, No. 9, Sep. 2019, pp. 1503-1506.

No interlayer →
substrate is damaged
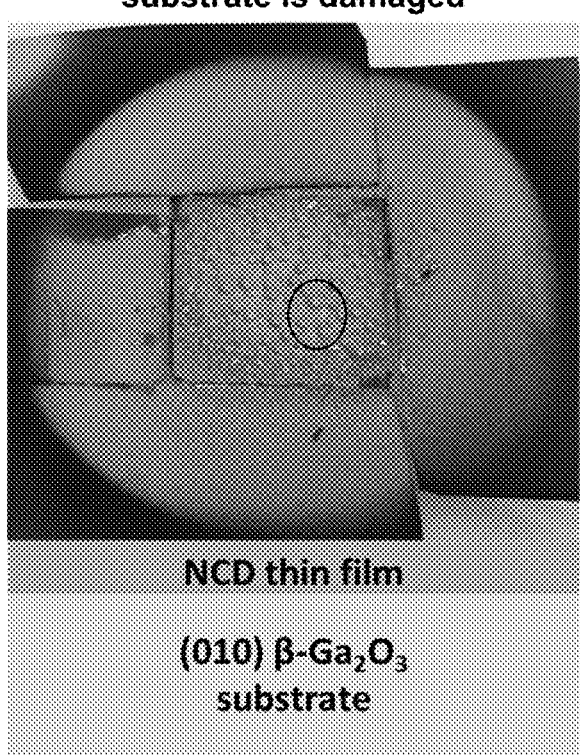
NCD thin film
(010) β-Ga₂O₃
substrate
*FIG. 3A*
High quality interlayer →
excellent NCD growth
*FIG. 3B*
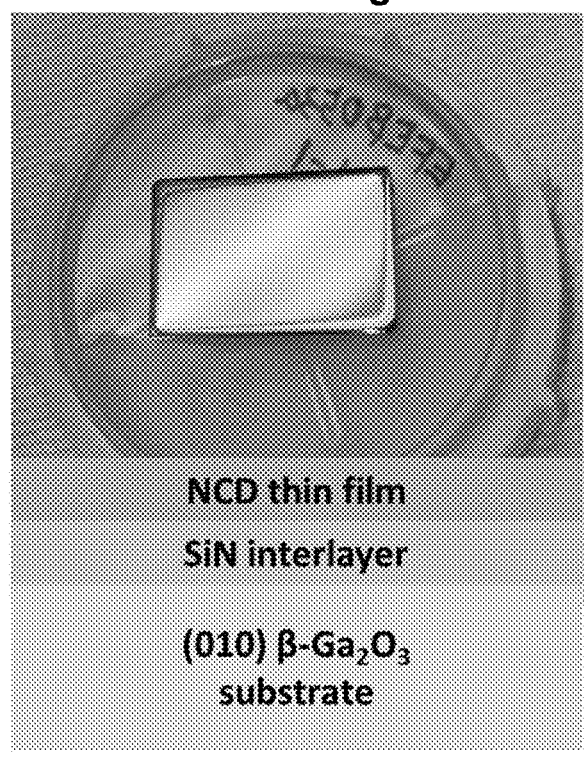
NCD thin film
SiN interlayer
(010) β-Ga₂O₃
substrate

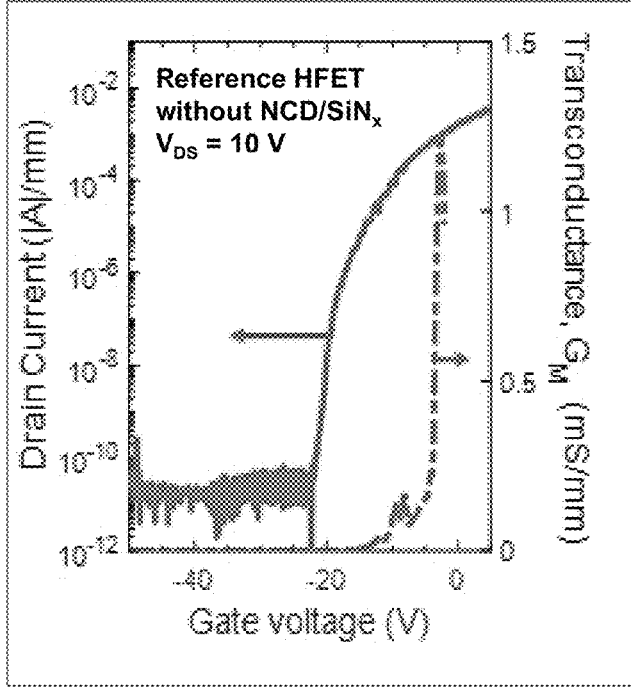
*FIG. 6A*
*FIG. 6B*
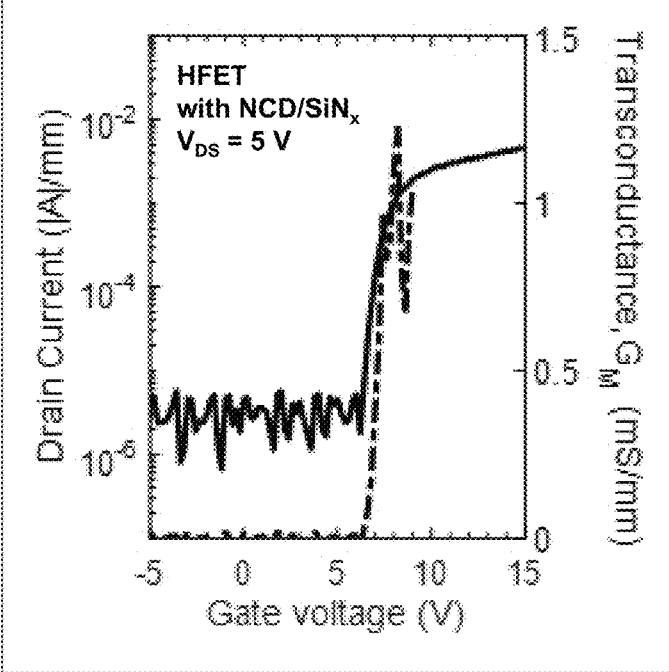

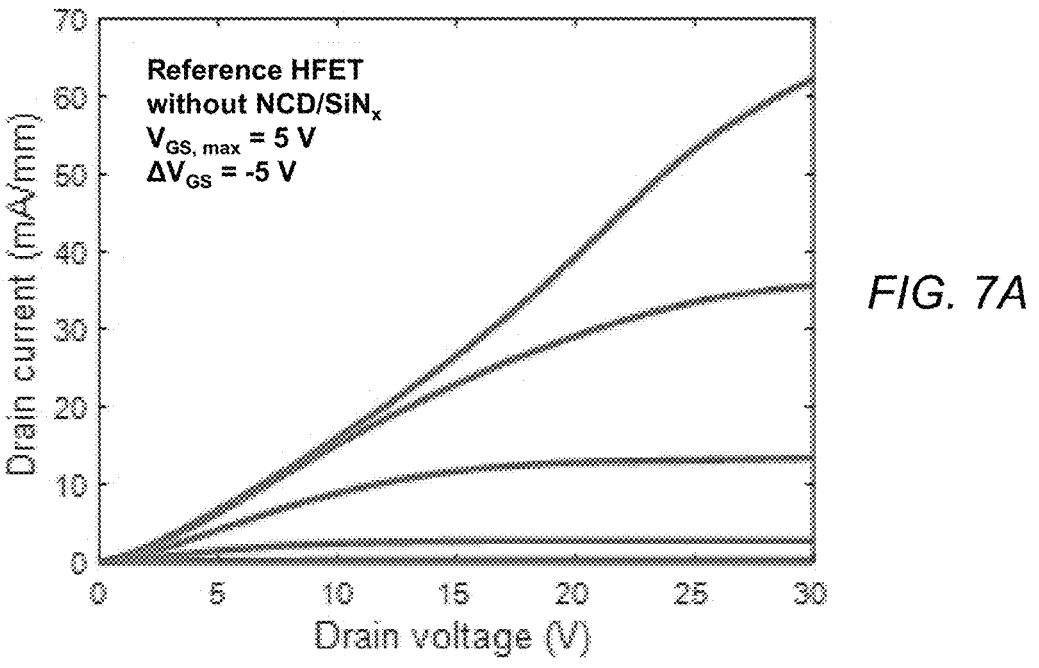
*FIG. 7A*
*FIG. 7B*
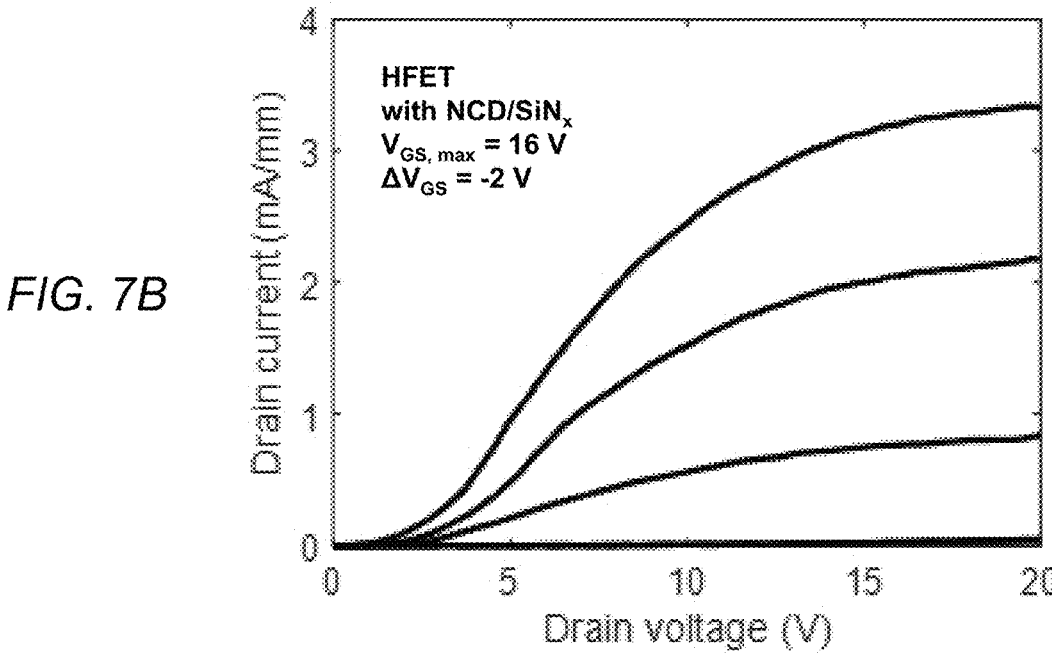

DIAMOND-CAPPED GALLIUM OXIDE TRANSISTOR

CROSS-REFERENCE

This Application is a Nonprovisonal of and claims the benefit of priority under 35 U.S.C. § 119 based on U.S. Provisional Patent Application No. 63/418,180 filed on Oct. 21, 2022. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #211207.

TECHNICAL FIELD

The present invention relates to the field of semiconductors and semiconductor devices, particularly to the field of thermal management in semiconductor devices.

BACKGROUND

Gallium oxide is an attractive material for power electronics due to its ultra-wide bandgap (4.6-4.9 eV), which gives rise to a very high critical electric field (6-8 MV/cm) and a substantially higher Baliga Figure of Merit (BFOM) for this material compared to wide bandgap technologies based on gallium nitride and silicon carbide semiconductors. See M. Higashiwaki, "β-Gallium Oxide Devices, Progress and Outlook," *Phys. Status Solidi* RRL, 15, 2100357 (2021) ("Higashiwaki 2021"). Significant efforts to develop this material into a technological platform for high-power, fast-switching electronic devices in recent years has brought together researchers in the fields of crystal growth, epitaxial film development, materials scientists, and electronic device. See M. Higashiwaki et al., "Gallium oxide ($Ga_2O_3$) metal-semiconductor field-effect transistors on single-crystal β-$Ga_2O_3$ (010) substrates," *Appl. Phys. Lett.* 100, 013504 (2012) ("Higashiwaki 2012"); S. J. Pearton, et al., "A review of $Ga_2O_3$ materials, processing, and devices," *Applied Physics Reviews* 5, 011301 (2018); Andrew J. Green, et al., "β-Gallium oxide power electronics," *APL Materials* 10, 029201 (2022); and Joseph A. Spencer, et al., "A review of band structure and material properties of transparent conducting and semiconducting oxides: $Ga_2O_3$, $Al_2O_3$, $In_2O_3$, ZnO, $SnO_2$, CdO, NiO, CuO, and $Sc_2O_3$," *Applied Physics Reviews* 9, 011315 (2022).

Recent developments have resulted in large-area substrates and epitaxial wafers, demonstration of shallow donors in $Ga_2O_3$ and its ternary alloy, β-$(Al_xGa_{1-x})_2O_3$, lateral transistors with high breakdown voltage, and vertical transistor architectures such as the Fin-FET and current aperture FET (CAVET) that show exceptional promise for next-generation power electronics. See Akito Kuramata et al., "High-quality β-Ga2O3 single crystals grown by edge-defined film-fed growth," *Japanese Journal of Applied Physics* 55, No. 12 (2016): 1202A2; Adam T. Neal, et al., "Donors and deep acceptors in β-Ga2O3," *Applied Physics Letters* 113, No. 6 (2018); Darshana Wickramaratne, et al., "Donor doping of corundum $(Al_xGa_{1-x})_2O_3$," *Applied Physics Letters* 121, No. 4 (2022); Arkka Bhattacharyya, et al. "4.4 kV β-$Ga_2O_3$ MESFETs with power figure of merit exceeding 100 MW cm$^{-2}$," *Applied Physics Express* 15, No. 6 (2022): 061001; and Man Hoi. Wong et al., "Vertical β-$Ga_2O_3$ power transistors: A review." *IEEE Transactions on Electron Devices* 67, No. 10 (2020): 3925-3937.

However, two challenges in development of $Ga_2O_3$-based devices persist: the ultra-low thermal conductivity of $Ga_2O_3$ and the impossibility of generating free hole carriers in this material due to self-trapping phenomena.

The low thermal conductivity of β-$Ga_2O_3$ is a well-known challenge for devices based on this ultra-wide bandgap semiconductor. See C. Yuan, et al., "Modeling and analysis for thermal management in gallium oxide field-effect transistors," *J. Appl. Phys.* 127, 154502 (2020). The extremely low thermal conductivity of β-$Ga_2O_3$ lead to severe self-heating, placing a significant thermal limit on output power densities of devices based on β-$Ga_2O_3$ thereon, resulting in severely limited device reliability. The development of high-performance β-$Ga_2O_3$-based power devices will thus require the incorporation of thermal management solutions, e.g. wafer bonding to a high thermal conductivity substrate, a top-side heat spreaders, advanced packaging, microfluidic cooling, or a combination thereof. See Higashiwaki 2021, supra.

One solution that has been used in other wide bandgap electronic devices such as GaN high electron mobility transistors is the incorporation of nanocrystalline diamond (NCD) into the device fabrication process, either as a diamond capping layer, a polycrystalline diamond substrate, or a feature within the existing substrate, see, e.g., U.S. Pat. No. 9,159,641 to Hobart et al., "Nanocrystalline Diamond Three-Dimensional Films in Patterned Semiconductor Substrates"; U.S. Pat. No. 9,305,858 to Hobart et al., "Nanocrystalline Diamond Three-Dimensional Films in Patterned Semiconductor Substrates"; U.S. Pat. No. 11,131,039 to Hobart et al., "Diamond on Nanopatterned Substrate"; and U.S. Pat. No. 11,634,834 to Hobart et al., "Diamond on Nanopatterned Substrate"; as an infill to thermal vias, see, e.g., U.S. Pat. No. 9,196,703 to Hobart et al., "Selective Deposition of Diamond in Thermal Vias"; or as a component of the electronic device, see, e.g., U.S. Pat. No. 9,331,163 to Koehler et al., "Transistor with Diamond Gate"; U.S. Pat. No. 9,466,684 to Koehler et al, "Transistor with Diamond Gate"; U.S. Pat. No. 10,312,175 to Hobart et al., "Diamond Air Bridge for Thermal Management of High Power Devices"; and U.S. Pat. No. 10,424,623 to Hobart et al., "Diamond Air Bridge for Thermal Management of High Power Devices."

All of these devices, however, are based on GaN rather than $Ga_2O_3$. Although there have been attempts to grow diamond thin films onto $Ga_2O_3$-based substrates, See M. Malakoutian et al., "Polycrystalline diamond growth on β-$Ga_2O_3$ for thermal management," 2021 *Appl. Phys. Express* 14 055502, attempts to incorporate NCD films into $Ga_2O_3$-based electronic devices to alleviate self-heating and improve output power density has faced several challenges.

First, hydrogen plasma present during chemical vapor deposition (CVD) of diamond will etch an unprotected $Ga_2O_3$ surface aggressively, necessitating a protective layer to be deposited onto $Ga_2O_3$ prior to diamond CVD. This layer has to be optimized such that it is not too thick, or else the thermal benefit of nanodiamond would not be optimal, and not too thin or else the protection of the $Ga_2O_3$ will not be effective.

Pinholes in the layer, a common defect in thin films, are also not acceptable and will result in large pits etched into the $Ga_2O_3$ crystal.

A barrier layer has also been necessary for CVD diamond growth on GaN. A dielectric layer such as silicon nitride has been used with good results in the past, allowing CVD growth of NCD at conditions similar to those of growth on silicon, silicon carbide, or other materials which do not require surface protection during NCD deposition.

In the case of $Ga_2O_3$, in addition to a barrier $SiN_x$ layer, a reduction in NCD growth temperature has been necessary as well, resulting in reduced growth rate and reduced NCD thermal conductivity. Future optimization of NCD growth conditions, such as introduction of small amounts of oxygen into the CVD process or depositing more robust barrier dielectrics such as SiC or $B_4C$, may alleviate these issues

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a solution to the self-heating problems of $Ga_2O_3$-based electronic devices by providing a method for incorporating NCD into the devices to provide thermal management and by providing $Ga_2O_3$-based devices that incorporate one or more NCD layers. The present invention overcomes the problems of incorporating such NCD layers into $Ga_2O_3$-based devices by depositing a protective interlayer onto the $Ga_2O_3$ layer before growth of the NCD layer to protect the $Ga_2O_3$ from damage caused during growth of the NCD layer.

In many embodiments, the protective interlayer will be in the form of a dielectric layer such as a $SiN_x$ layer deposited on an upper surface of the $Ga_2O_3$ barrier layer in the device. The presence of the protective dielectric interlayer prevents etch damage to the $Ga_2O_3$ surface caused by hydrogen plasma during diamond CVD growth and enables the formation of a high-quality continuous NCD layer which can provide effective thermal management and thereby reduce self-heating in the device.

The thickness of the $SiN_x$ interlayer can be tuned to minimize thermal resistance from the $Ga_2O_3$ device layer into the NCD heat spreading layer. For example, the thickness of the $SiN_x$ layer can be decreased, e.g., to 5-10 nm, to improve the impact of the NCD on thermal management in the device or can be increased, e.g., to 50-100 nm, to provide additional protection of the $Ga_2O_3$ layer.

In other embodiments, growth conditions of the NCD layer such as growth temperatures, pressure, methane/hydrogen precursor flow rate, and power can be tuned, e.g., to provide a high quality, continuous layer of NCD at close proximity to the $Ga_2O_3$ layer.

BRIEF DESCRIPTION OF THE DRAWINGS

FIGS. 3A and 3B are SEM images illustrating how a barrier dielectric layer in accordance with the present invention protects an NCD-coated $Ga_2O_3$ crystal during an $H_2$ plasma etch.

FIGS. 6A and 6B are plots showing DC transfer curves for β-$Ga_2O_3$ devices without (FIG. 6A) and with (FIG. 6B) NCD/$SiN_x$ layers in accordance with the present invention.

FIGS. 7A and 7B are plots showing DC output curves for β-$Ga_2O_3$ devices without (FIG. 7A) and with (FIG. 7B) NCD/$SiN_x$ layers in accordance with the present invention.

DETAILED DESCRIPTION

Figure 1:
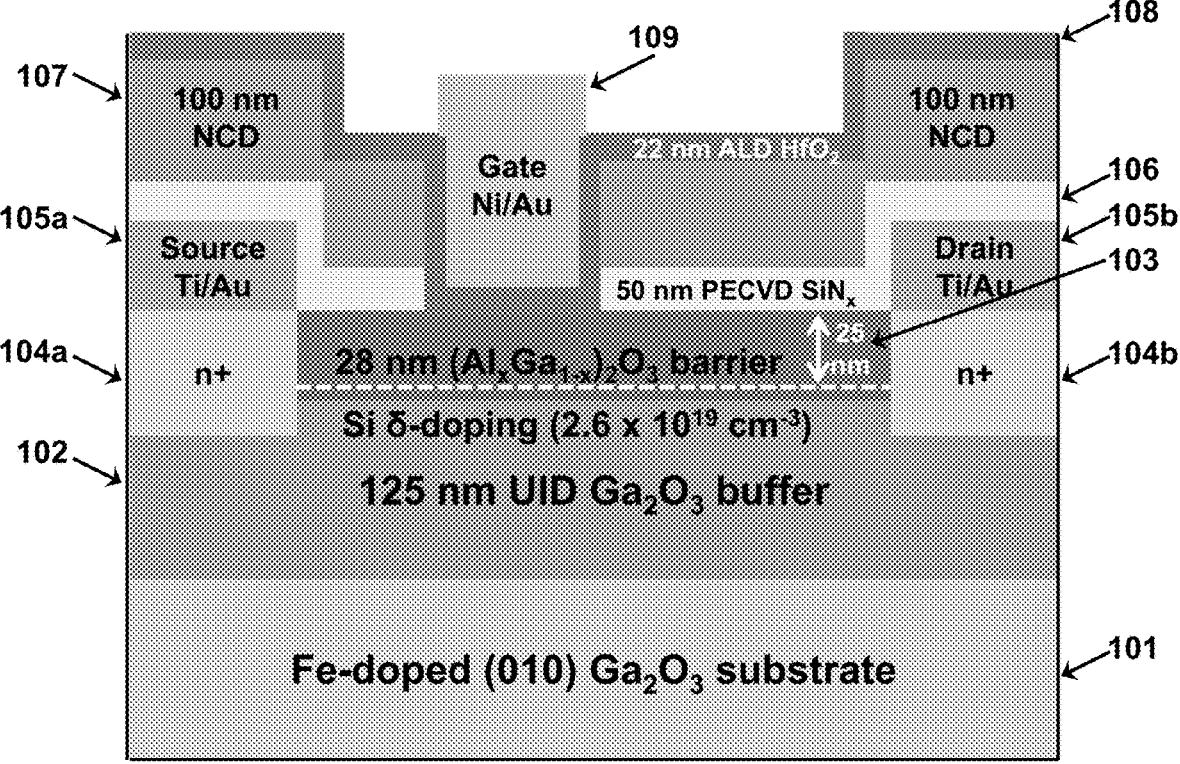
FIG. 1 is a block schematic illustrating an exemplary $Ga_2O_3$-based electronic device incorporating an NCD heat-spreading layer in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

For example, although the present invention will be described below in the context of an exemplary $Ga_2O_3$-based heterostructure grown via ozone-assisted molecular beam epitaxy ($O_3$-MBE), one skilled in the art will readily recognize that heterostructures having other configurations or grown by other means can also benefit from thermal management provided by incorporation of an NCD layer with protective interlayer disposed between the NCD and the $Ga_2O_3$, and all such alternative heterostructures are deemed to be within the scope of the present disclosure.

As described above, the low thermal conductivity of β-$Ga_2O_3$ is a significant concern for maximizing the potential of this ultra-wide bandgap semiconductor technology, but previous attempts to incorporate NCD into $Ga_2O_3$-based devices have not been successful.

The present invention overcomes the problems of incorporating NCD into such $Ga_2O_3$-based devices. In accordance with the present invention, a protective interlayer is deposited onto the $Ga_2O_3$ layer before growth of the NCD layer to protect the $Ga_2O_3$ from damage caused during growth of the NCD layer. In this way, the present invention enables the formation of devices that incorporate NCD as a top-side, device-level thermal management solution on a lateral β-$Ga_2O_3$ transistor.

In many embodiments, the protective interlayer will be in the form of a dielectric layer such as a $SiN_x$ layer deposited on an upper surface of the $Ga_2O_3$ barrier layer in the device. The presence of the protective dielectric interlayer prevents etch damage to the $Ga_2O_3$ surface caused by hydrogen plasma during diamond CVD growth and enables the formation of a high-quality continuous NCD layer which can provide effective thermal management and thereby reduce self-heating in the device.

Thus, as described in more detail below, in accordance with the present invention, an NCD heat-spreading layer is grown via microwave plasma enhanced chemical vapor deposition on a $Ga_2O_3$ layer in a $Ga_2O_3$-based heterostructure, where a protective dielectric interlayer such as a $SiN_x$ layer is deposited on the $Ga_2O_3$ layer prior to growth of the NCD layer to protect the surface of the $Ga_2O_3$ from damage caused by the diamond deposition conditions.

In many embodiments, the $Ga_2O_3$-based structure is a $\beta$-$(Al_xGa_{1-x})_2O_3/\beta$-$Ga_2O_3$ heterostructure, with the NCD being deposited prior to the gate formation, though other embodiments in which the NCD layer is deposited after the Ni/Au gate contact or, conversely, the Ni/Au gate is deposited onto an existing NCD layer, are also possible.

The incorporation of the NCD heat-spreading layer enables the formation of a $\beta$-$(Al_xGa_{1-x})_2O_3/\beta$-$Ga_2O_3$ heterostructure field-effect transistor (HFET) showing a decrease in total thermal resistance at the gate by >40%.

FIG. 1 illustrates an exemplary embodiment of a $\beta$-$(Al_xGa_{1-x})_2O_3/Ga_2O_3$ heterostructure field-effect transistor (HFET) incorporating a nanocrystalline diamond (NCD) heat-spreading layer and $SiN_x$ protective interlayer in accordance with the present invention. As noted above, in the embodiment illustrated in FIG. 1, the NCD layer was etched prior to deposition of the Ni/Au gate contact, but other embodiments in which the NCD layer is deposited after the Ni/Au gate contact or, conversely, the Ni/Au gate is deposited onto an existing NCD layer, are also possible.

As illustrated in FIG. 1, such an exemplary device can comprise a 125 nm-thick unintentionally doped (UID) $Ga_2O_3$ buffer layer 102 grown on an Fe-doped (010) $Ga_2O_3$ substrate 101, with a 28 nm-thick $(Al_xGaO_{1-x})_2O_3$ barrier layer 103 disposed on the $Ga_2O_3$ layer, where the AlGaO layer 103 is delta-doped with Si approximately 3 nm above its interface with $Ga_2O_3$ layer 102 (i.e., approximately 25 nm from the top of the layer in the case shown in the FIGURE). Si ions are implanted and annealed in an $N_2$ atmosphere for 30 min at 925° C. to form n+ areas 104a/104b for the source and drain, respectively, with Ti/Au being deposited by e-beam evaporation on each of the n+ areas and annealed in an $N_2$ atmosphere for approximately one minute at 470° C. to form Ohmic source/drain contacts 105a/105b. The specific contact resistivity, mobility, sheet carrier concentration, and sheet resistance of this structure at room temperature were measured as follows:

| | |
|---|---|
| contact resistivity | $4.3 \times 10^{-4} \, \Omega \times cm^2$ |
| mobility | $54 \, cm^2/V \cdot s$ |
| sheet carrier concentration | $1.26 \times 10^{13} \, cm^{-2}$ |
| sheet resistance | $9.1 \, k\Omega/square$ |

In accordance with the present invention, a $SiN_x$ layer 106 having an exemplary thickness of about 50 nm was then deposited by plasma-enhanced chemical vapor deposition (PECVD) at 400° C. The presence of the $SiN_x$ layer protects the $Ga_2O_3$ layer from damage caused by the $H_2$ plasma required for growth of NCD layer 107.

NCD layer 107 was then grown on the $Ga_2O_3$ layer as protected by the $SiN_x$ layer. The NCD layer can be grown by any suitable process, but typically will be grown via microwave plasma enhanced chemical vapor deposition (MW-CVD). To start the NCD growth process, nucleation sites for the growth of NCD layer 107 were facilitated via a seeding method using detonation nanodiamond powder. In an exemplary case, the growth chamber was pre-treated with 200 sccm of $H_2$ at a temperature of 100° C. and a pressure of 15 torr for 1 hour. NCD growth was then performed using a 1.5% $CH_4/H_2$ concentration at a temperature of 400° C., pressure of 15 Torr, and power of 800 W for about 6 hours to produce an NCD film having a thickness of about 100 nm. Growth temperature for the NCD can range up to 650° C., with the other parameters also being adjustable as appropriate, i.e., power can range from 500-1000 W, pressure can range from 5-20 Torr, and the $CH_4/H_2$ concentration can range from 0.5 to 3%, with the specific values of each of these parameters depending on the process conditions and the intended end use of the device.

The NCD layer and $SiN_x$ interlayer were then etched to expose the source/drain metal contacts on which electrical connections are made and to define the gate region. In an exemplary embodiment, this etching can be performed using an $O_2$ inductively coupled plasma (ICP) etch of the NCD layer at 1000 W ICP power and 100 W reactive-ion etch (RIE) power, followed by an ICP-RIE $SF_6$ etch of the $SiN_x$ interlayer at ICP 200 W, RIE 50 W, but other suitable etching conditions can be used, e.g., pressures of about 5 mT, $O_2$ flow rate of 10-50 sccm, and temperatures of about 20-30° C. In other embodiments, the etch can be performed using a $SF_6$ plasma rather than an $O_2$ plasma.

Following the etching of the NCD and $SiN_x$, a 22 nm $HfO_2$ gate dielectric layer 108 was then deposited by atomic layer deposition (ALD) on the upper surface of the NCD layer and the sides and bottom of the etched trench, and finally the gate contacts 109 were formed by depositing a 20/200 nm thick Ni/Au metal stack into the thus-defined trench.

Other etching regimes can also be used to define the gate area. For example, in some embodiments, a $SiN_x$ mask can be deposited on an upper surface of the NCD layer to protect the NCD surface during the $SF_6$ etch, while in other embodiments, a wet etching (e.g., using buffered HF) can be used on the $SiN_x$ interlayer to minimize plasma damage to the $Ga_2O_3$ active region. In still other embodiments, the gate area can be defined by etching the $SiN_x$ layer before the growth of the NCD layer.

Figures 2A, 2B, 2C, 2D, 2E, 2F:
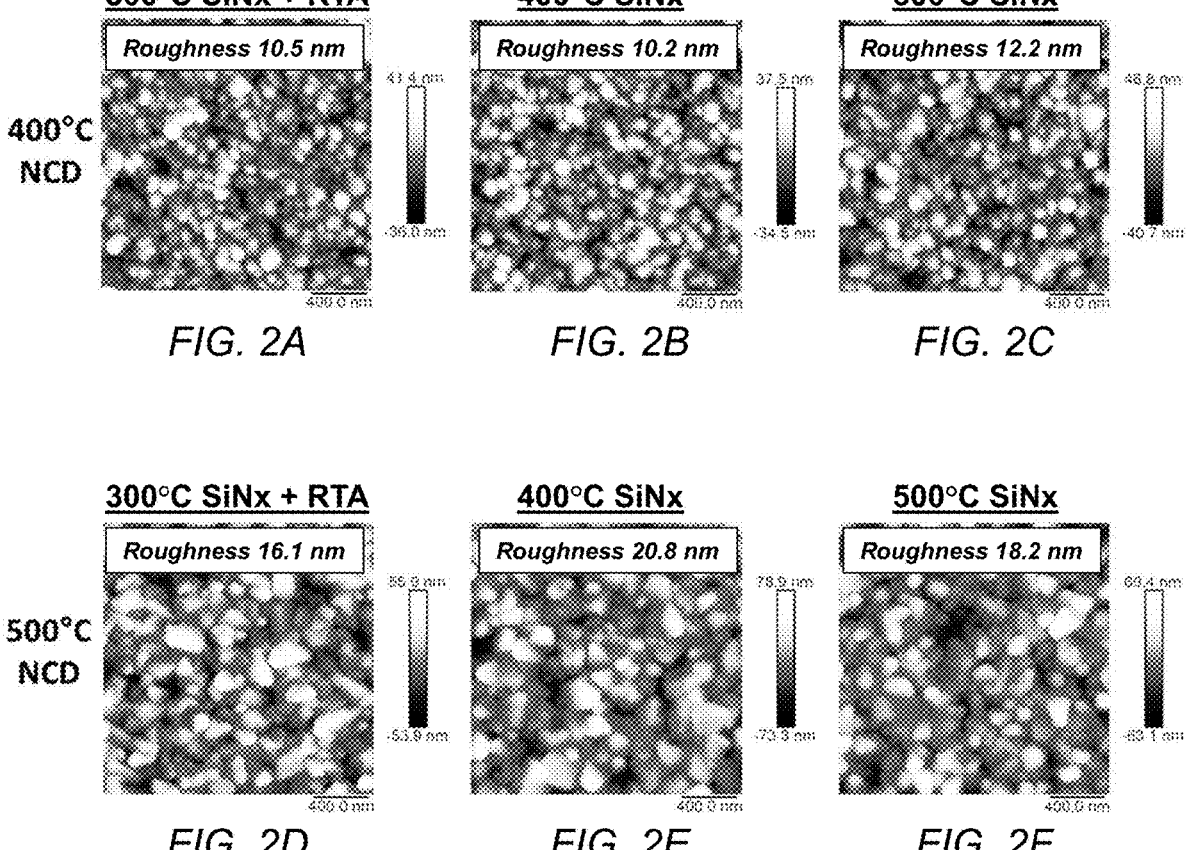
FIGS. 2A-2F are a β-series of atomic force microscope (AFM) images showing NCD films grown on $Ga_2O_3$ at 400° C. and 500° C. with three different $SiN_x$ barrier dielectric layers.

FIGS. 2A-2F are a $\beta$-series of atomic force microscope (AFM) images showing NCD films grown on $Ga_2O_3$ at 400° C. (FIGS. 2A-2C) and 500° C. (FIGS. 2D-2F) with different $SiN_x$ barrier dielectric layers, i.e., with a rapid-thermal annealed (RTA) $SiN_x$ barrier layer deposited at 300° C. (FIGS. 2A and 2D), a $SiN_x$ barrier layer deposited at 400° C. (FIGS. 2B and 2E), and a $SiN_x$ barrier layer deposited at 500° C. (FIGS. 2C and 2F). The different deposition and annealing conditions of the $SiN_x$ layers were aimed at densifying these dielectric layers in order to reduce their etch rate during NCD deposition as much as possible.

The SEM images in FIGS. 3A and 3B show how a barrier dielectric layer in accordance with the present invention protects an NCD-coated $Ga_2O_3$ crystal during an $H_2$ plasma etch. As can be seen from the image in FIG. 3A, an NCD-coated $Ga_2O_3$ crystal that is not protected with a dielectric coating is damaged during the etch, with multiple gallium droplets being readily visible on the surface of the crystal. In contrast, the NCD-coated $Ga_2O_3$ crystal shown in FIG. 3B includes a properly deposited barrier dielectric, and exhibits a smooth, continuous NCD layer on the surface of the $Ga_2O_3$.

Figure 4:
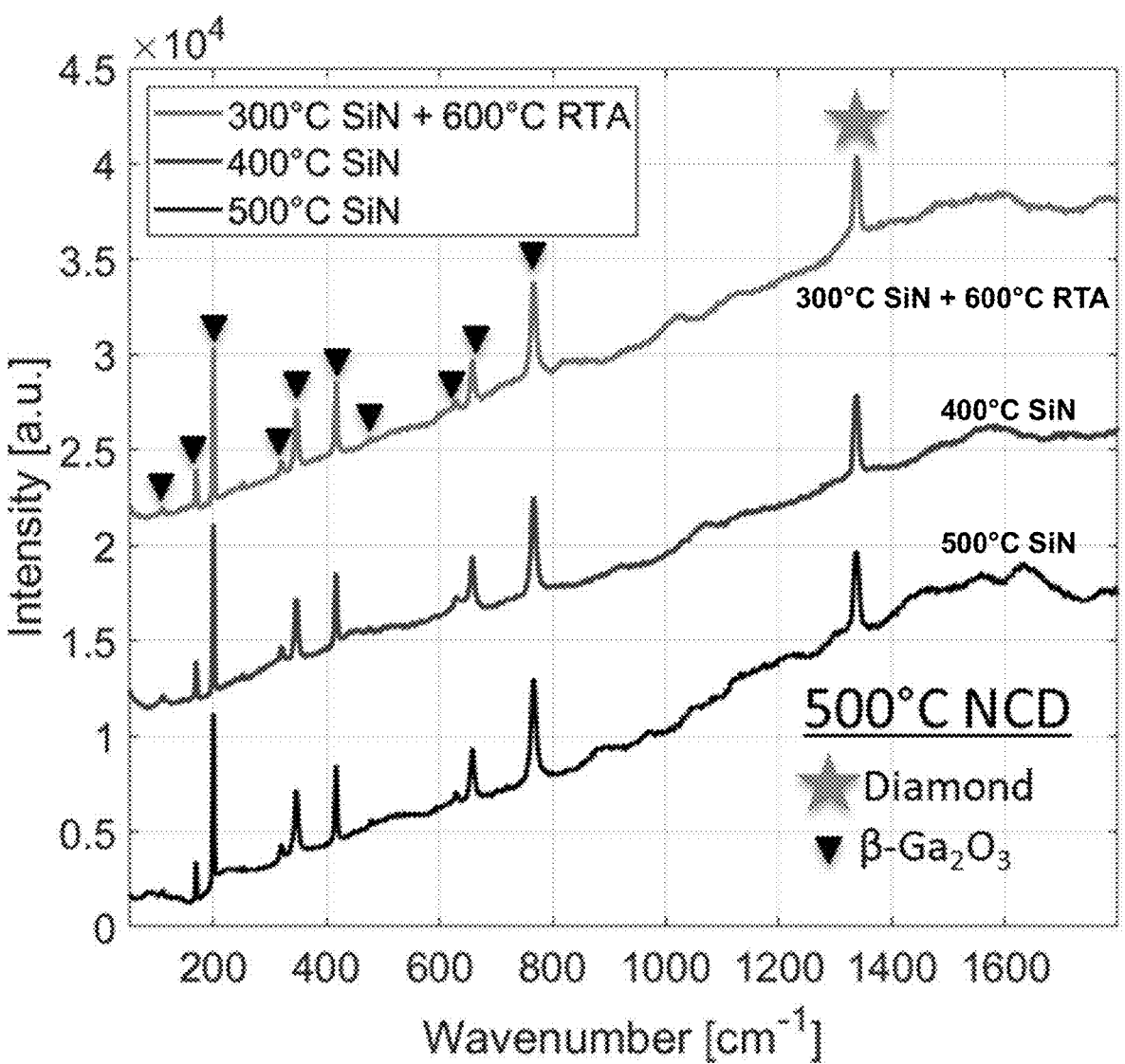
FIG. 4 is a plot showing Raman spectra confirming growth of NCD on $Ga_2O_3$ having the various $SiN_x$ barrier dielectrics shown in FIGS. 2D-2F.

The plot in FIG. 4 shows Raman spectra measured on the NCD samples grown on $Ga_2O_3$ at 500° C. with different $SiN_x$ dielectric interlayers shown in FIGS. 2D-2F. These spectra show both the signature Raman mode of sp3-bonded diamond and the signature Raman modes of monoclinic $\beta$-$Ga_2O_3$, confirming growth of the high quality NCD film

7 on $\beta$-Ga$_2$O$_3$ without compromising the Ga$_2$O$_3$ quality. This would not be possible to do on a wafer scale without the use of a barrier dielectric such as SiN$_x$, precluding the use of NCD as top-side heat spreading layer for thermal management of Ga$_2$O$_3$ electronic devices.

Figure 5:
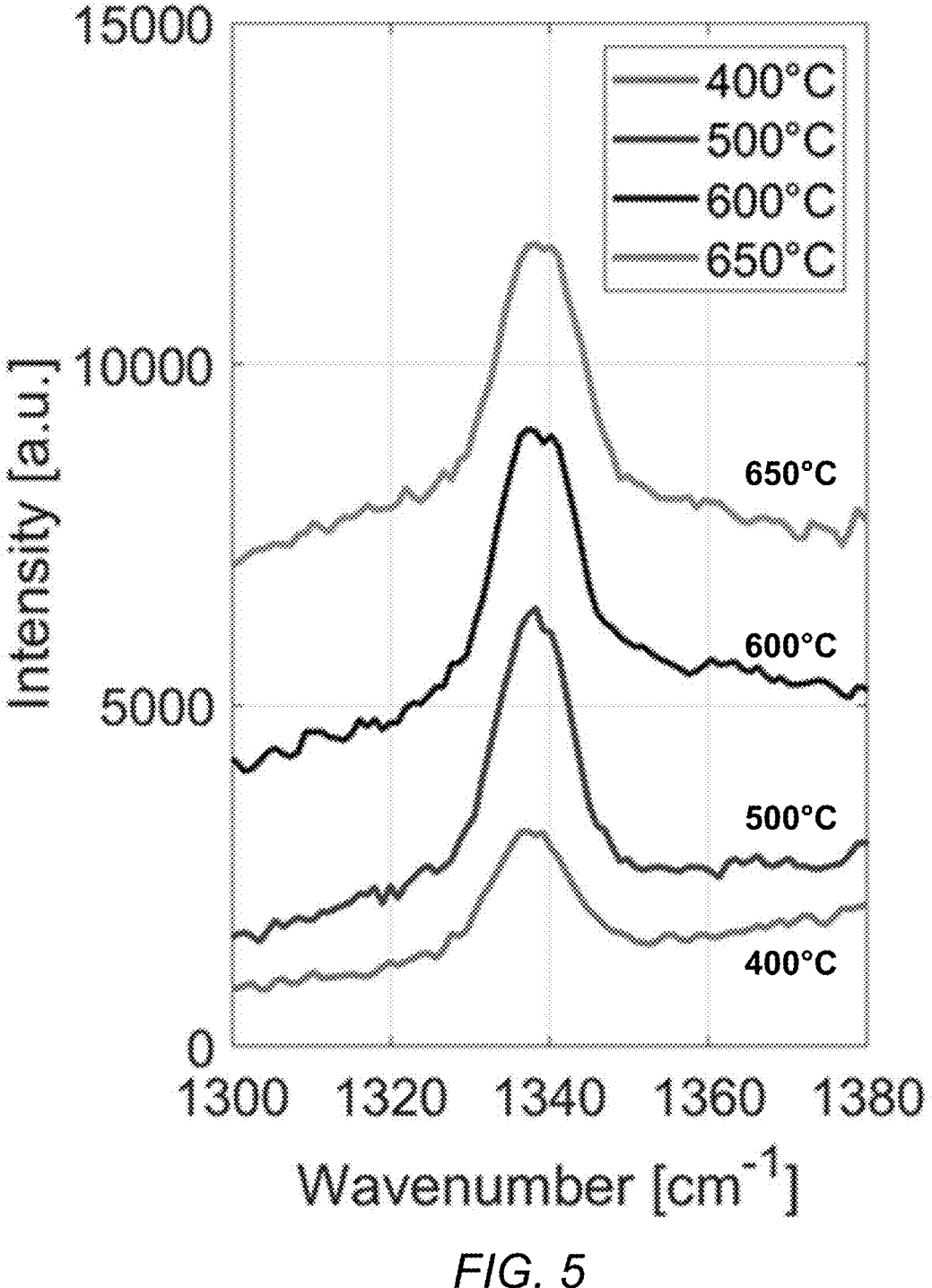
FIG. 5 is a plot showing Raman spectra confirming growth of NCD on $Ga_2O_3$ with a protective interlayer up to a temperature of 650° C.

The plot in FIG. 5 shows Raman spectra of NCD films grown on Ga$_2$O$_3$ with a protective SiN$_x$ interlayer in accordance with the present invention up to a temperature of 650° C. The presence of a Raman peak near 1340 cm$^{-1}$, specifically at 1332.5 cm$^{-1}$, confirms the covalent sp3 bonding of the deposited NCD layer. The higher NCD deposition temperature leads to increased NCD grain size and thermal conductivity without compromising the underlying Ga$_2$O$_3$ layers, enabling more efficient heat spreading compared to NCD grown at a lower temperature, e.g., at 400° C.

Thus, as confirmed by the Raman spectra in FIGS. 4 and 5, high-quality NCD thermal management layers can successfully be grown on Ga$_2$O$_3$ having a SiN$_x$ interlayer deposited thereon before growth of the NCD, in accordance with the present invention.

To test the performance of a device having a structure such as that illustrated in FIG. 1, on-state drain current was measured via DC current-voltage testing for a reference HFET lacking an NCD/SiN$_x$ stack in accordance with the present invention (FIG. 6A) and an HFET having an NCD/SiN$_x$ stack in accordance with the present invention (FIG. 6B).

As can be seen from the plots in FIGS. 6A and 6B, the reference device without the incorporation of an NCD/SiN$_x$ stack (FIG. 6A) is in a depletion mode or "normally-on," and has a much larger on/off current ratio than is exhibited by a device having an NCD/SiN$_x$ stack in accordance with the present invention (FIG. 6B), i.e., V$_{DS}$=10V vs. V$_{DS}$=5V. By etching through the NCD/SiN$_x$ layers above the gate in a device in accordance with the present invention, as illustrated in FIG. 1, enhancement mode, or "normally-off" device behavior, can be achieved. It is well known that enhancement mode transistors are highly desirable for operational safety of power electronic systems, and so the present invention enables the formation of these highly desirable devices.

The plots in FIGS. 7A and 7B show the DC output curves for the devices with and without an NCD/SiN$_x$ stack discussed above with respect to FIGS. 6A and 6B. As can be seen by the plots in FIGS. 7A and 7B, the reference device without the NCD/SiN$_x$ stack in accordance with the present invention (FIG. 7A) shows a 20× higher drain current compared to the device having such a stack (FIG. 7B). That is, as illustrated by the plot in FIG. 7B, a lower drain current is seen in the device having the NCD/SiN$_x$ stack, likely due to the plasma damage to the $\beta$-(Al$_x$Ga$_{1-x}$)$_2$O$_3$ active region during diamond formation in the structure without the protective dielectric layer. Although lower drain current is observed, we still achieve current modulation with this device structure. Improvement to the NCD/SiN$_x$ removal process during gate formation will result in higher drain current.

Thermal measurements of devices with and without an NCD/SiN$_x$ stack were performed using a TMX Scientific T° Imager (532 nm, 100× objective) at a base temperature maintained at 20° C. Power dissipated in the device was monitored using an oscilloscope. A maximum power density of ~0.6.58 W/mm, with a gate voltage of 0 V, was measured before catastrophic failure occurred on the "Gate on NCD" device.

Figure 8:
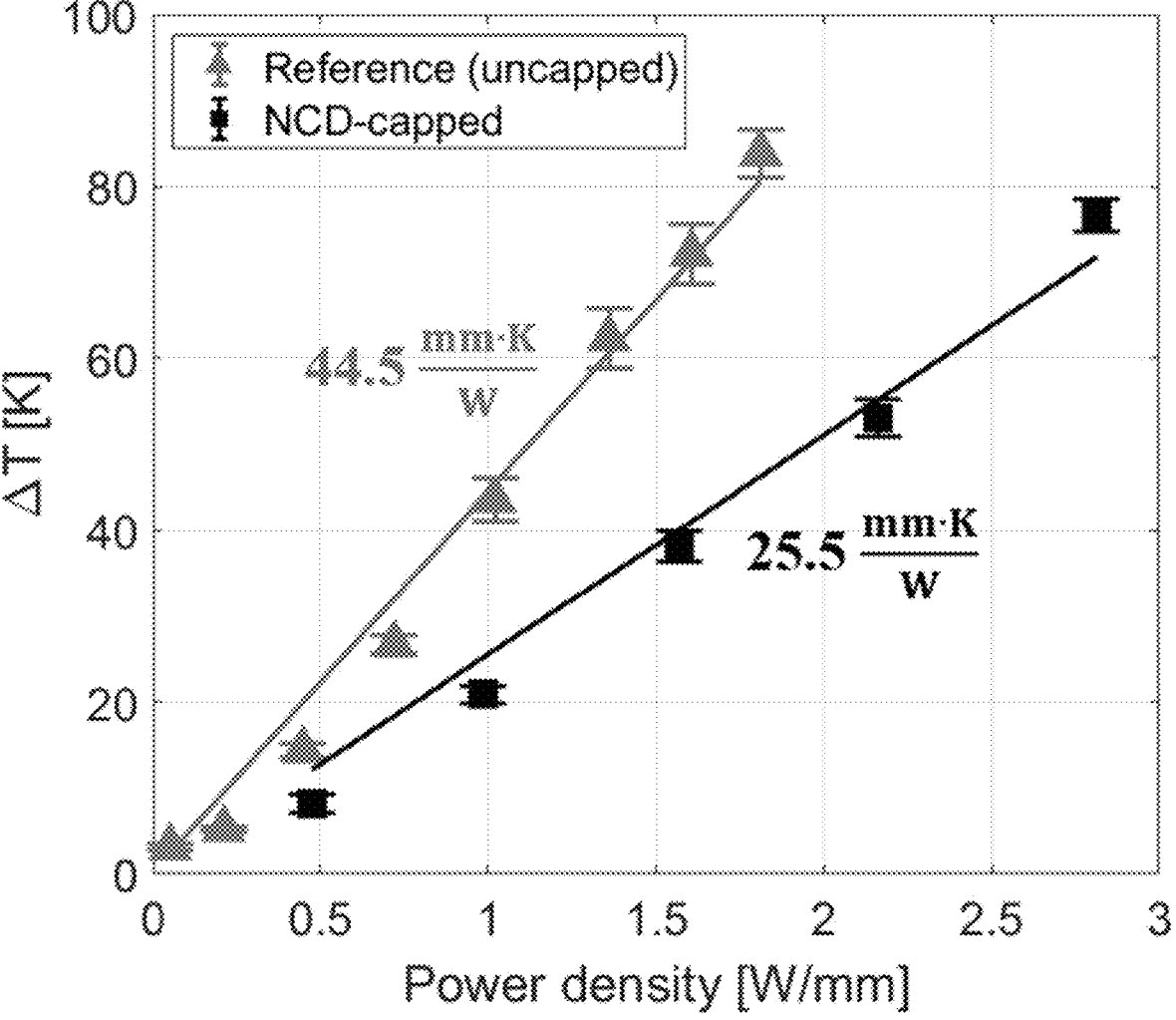
FIG. 8 is a plot illustrating the average temperature rise as a function of power density for HFET devices with and without NCD/$SiN_x$ layers in accordance with the present invention.

The plot in FIG. 8 shows the average temperature rise at the gate as a function of power density where the slope corresponds to the device thermal resistance. A 40% reduction in the thermal resistance at the gate electrode was observed with the incorporation of the NCD heat spreading layer when compared to a reference uncapped HFET. Optimization of the NCD/SiN$_x$ etch within the gate region will be required to maintain good device performance with the incorporation of this thermal management technique.

Advantages and New Features

The main new feature introduced by the present invention is the reduced device temperature as measured by thermoreflectance imaging of the source/drain/gate metal contacts of the fabricated device. The thermal resistance reduction in the device from 44.5 mmK/W to 25.5 mmK/W, combined with the high maximum power density in the on state, are the best reported for a Gallium Oxide transistor to-date.

The improved thermal management of such Ga$_2$O$_3$-based devices provided by NCD films that can be deposited on the Ga$_2$O$_3$ due to the presence of a dielectric interlayer in accordance with the present invention leads to lower device operating temperature, increased carrier mobility, higher measured output current density, improved thermal budget, as well as improved overall device reliability.

Alternative approaches to thermal management in gallium oxide devices has been proposed via wafer bonding to higher thermal conductivity substrate such as silicon, silicon carbide, or diamond. See Y. Xu et al., "Direct wafer bonding of Ga$_2$O$_3$—SiC at room temperature," *Ceramics International* 45 (5) 6552 (2019); M. Liao et al., "Interfacial Thermal Transport of Thinned and Chemical Mechanical Polished (−201) $\beta$-Ga2O3 Direct Wafer Bonded to (001) Si," *Electronic Materials Conference*, 2022, pp. 110-111; and T. Matsumae et al., supra.

However, this approach has not resulted in levels of thermal resistance reduction observed via the top-side diamond capping approach of the present invention. Other alternative methods include capping via materials other than diamond, such as aluminum nitride, but again, such methods have been less effective due to lower thermal conductivity of the capping layer. See J. S. Lundh et al., "AlN-capped $\beta$-(Al$_x$Ga$_{1-x}$)$_2$O$_3$/Ga$_2$O$_3$ heterostructure field-effect transistors for near-junction thermal management of next generation power devices," *Proc. Dev. Res. Conf.* (2022).

ALTERNATIVES

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein.

For example, although the present invention is described in the context of $\beta$-Ga$_2$O$_3$, an NCD/SiN$_x$ stack can also be used for thermal management of devices based on other forms of Ga$_2$O$_3$ such as $\alpha$-Ga$_2$O$_3$, $\gamma$-Ga$_2$O$_3$, $\delta$-Ga$_2$O$_3$, $\epsilon$-Ga$_2$O$_3$, or $\kappa$-Ga$_2$O$_3$.

An NCD/SiN$_x$ or an NCD/SiO$_2$ stack in accordance with the present invention can also be incorporated into devices based on alloys of Ga$_2$O$_3$, such as devices based on (Al$_x$Ga$_{1-x}$)$_2$O$_3$, where 0≤x≤1.

The present application contemplates any and all modifications within the spirit and scope of the underlying invention described and claimed herein, and all such modifications and alternative embodiments are deemed to be within the scope and spirit of the present disclosure.

What is claimed is:

1. A method for forming a $Ga_2O_3$-based electronic device having enhanced thermal management properties, comprising:

forming a $Ga_2O_3$-based buffer layer on a substrate;

forming a $Ga_2O_3$-based barrier layer on the $Ga_2O_3$-based buffer layer;

depositing a $SiN_x$ interlayer on the $Ga_2O_3$-based barrier layer; and forming a nanocrystalline diamond (NCD) layer on the $Ga_2O_3$ barrier layer;

wherein the $SiN_x$ interlayer protects the $Ga_2O_3$ barrier layer from damage during formation of the NCD layer; and wherein the NCD layer provides thermal management to the device.

2. The method according to claim 1, wherein the NCD layer is grown on the barrier layer capped $Ga_2O_3$ semiconductor.

3. The method according to claim 2, wherein the NCD layer is grown by microwave plasma enhanced chemical vapor deposition (MW-CVD) or hot filament CVD (HF-CVD).

4. The method according to claim 1, wherein the $Ga_2O_3$ is $\beta$-$Ga_2O_3$.

5. The method according to claim 1, wherein the buffer layer comprises unintentionally doped $\beta$-$Ga_2O_3$ and the barrier layer comprises $\beta$-$(Al_xGa_{1-x})_2O_3$.

6. The method according to claim 1, further comprising doping the $Ga_2O_3$ buffer layer with a hydrogenic donor species.

7. The method according to claim 6, wherein the hydrogenic donor species comprises silicon (Si), germanium (Ge), or tin (Sn).

8. The method according to claim 1, further comprising forming source, gate, and drain electrodes to form a heterostructure field-effect transistor (HFET).

9. An $Ga_2O_3$-based electronic device having enhanced thermal management properties, comprising:

a $Ga_2O_3$-based buffer layer formed on a substrate;

a $Ga_2O_3$-based barrier layer formed on the $Ga_2O_3$-based buffer layer;

a $SiN_x$ interlayer deposited on the $Ga_2O_3$-based barrier layer; and a nanocrystalline diamond (NCD) layer formed on the $Ga_2O_3$ barrier layer wherein the $SiN_x$ interlayer protects the $Ga_2O_3$ barrier layer from damage during growth of the NCD layer; and wherein the NCD layer provides thermal management to the device.

10. The device according to claim 9, wherein the $Ga_2O_3$ is $\beta$-$Ga_2O_3$.

11. The device according to claim 9, wherein the buffer layer comprises unintentionally doped $\beta$-$Ga_2O_3$ and the barrier layer comprises $\beta$-$(Al_xGa_{1-x})_2O_3$.

12. The device according to claim 9, further comprising doping the $Ga_2O_3$ buffer layer with a hydrogenic donor species.

13. The device according to claim 9, wherein the hydrogenic donor species comprises silicon (Si), germanium (Ge), or tin (Sn).

14. The device according to claim 9, wherein the device is a heterostructure field-effect transistor (HFET), a field effect transistor (FET), a metal-oxide-semiconductor field effect transistor (MOSFET), a modulation-doped field effect transistor (MODFET), a current aperture vertical electron transistor (CAVET), a FinFET, or a hot electron transistor (HET).

* * * * *